(12) United States Patent
Kim et al.

(10) Patent No.: US 7,940,085 B2
(45) Date of Patent: May 10, 2011

(54) INVERTER, METHOD OF OPERATING THE SAME AND LOGIC CIRCUIT COMPRISING INVERTER

(75) Inventors: Sangwook Kim, Yongin-si (KR); Ihun Song, Seongnam-si (KR); Changjung Kim, Yongin-si (KR); Jaechul Park, Seoul (KR); Sunil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/585,557

(22) Filed: Sep. 17, 2009

(65) Prior Publication Data
US 2010/0079169 A1   Apr. 1, 2010

(30) Foreign Application Priority Data
Oct. 1, 2008   (KR) .................. 10-2008-0096721

(51) Int. Cl.
*H03K 19/094* (2006.01)
(52) U.S. Cl. .......................................... 326/83; 326/26
(58) Field of Classification Search ............. 326/82–87
See application file for complete search history.

(56) References Cited

U.S. PATENT DOCUMENTS

| 6,989,706 | B2* | 1/2006 | Sekigawa et al. | 327/434 |
| 7,180,135 | B1* | 2/2007 | Ioannou et al. | 257/347 |
| 7,691,666 | B2* | 4/2010 | Levy et al. | 438/104 |
| 2004/0189373 | A1* | 9/2004 | Sekigawa et al. | 327/342 |
| 2005/0158929 | A1* | 7/2005 | Yamazaki et al. | 438/166 |
| 2007/0139072 | A1* | 6/2007 | Yamaoka et al. | 326/33 |

FOREIGN PATENT DOCUMENTS

| JP | 3-161966 | 7/1991 |
| JP | 10-98197 | 4/1998 |
| JP | 11-338439 | 12/1999 |
| JP | 2000-91591 | 3/2000 |
| JP | 2000-269507 | 9/2000 |
| JP | 2003-050570 | 2/2003 |
| JP | 2003-174037 | 6/2003 |
| JP | 5-267620 | 10/2003 |
| JP | 2007-173385 | 7/2007 |

\* cited by examiner

*Primary Examiner* — Don P Le
(74) *Attorney, Agent, or Firm* — Harness, Dickey & Pierce, P.L.C.

(57) ABSTRACT

Provided are an inverter, a method of operating the inverter, and a logic circuit including the inverter. The inverter may include a load transistor and a driving transistor, and at least one of the load transistor and the driving transistor may have a double gate structure. A threshold voltage of the load transistor or the driving transistor may be adjusted by the double gate structure, and accordingly, the inverter may be an enhancement/depletion (E/D) mode inverter.

26 Claims, 16 Drawing Sheets

INVERTER, METHOD OF OPERATING THE SAME AND LOGIC CIRCUIT COMPRISING INVERTER

CROSS-REFERENCE TO RELATED APPLICATION

This application claims priority under 35 U.S.C. §119 to Korean Patent Application No. 10-2008-0096721, filed on Oct. 1, 2008, in the Korean Intellectual Property Office (KIPO), the entire contents of which are incorporated herein by reference.

BACKGROUND

1. Field

Example embodiments relate to an inverter, a logic circuit and a semiconductor device including the inverter.

2. Description of the Related Art

In semiconductor integrated circuits, e.g., dynamic random access memories (DRAMs), static random access memories (SRAMs), non-volatile memories, liquid crystal display (LCD) devices, and organic light emitting devices, various logic circuits, for example, NAND (not and) and NOR (not or) circuits, are used. An inverter is a basic component of logic circuits.

In general, a Si-based inverter is a complementary metal-oxide semiconductor (CMOS) inverter including both an n-channel metal-oxide semiconductor (NMOS) transistor and a p-channel metal-oxide semiconductor (PMOS) transistor. When a Si layer is used as a channel layer, the NMOS or PMOS transistor may be more easily formed by varying the type of doping elements used for the channel layer, and thus, a CMOS inverter may be easily manufactured. For example, a p-channel layer is formed by doping a Si layer with a Group III element, e.g., boron (B).

However, when a channel layer is formed using an oxide semiconductor, manufacturing a p-channel layer due to the characteristics of the material of the oxide semiconductor may be difficult. That is, channel layers formed using an oxide semiconductor are usually n-channel layers. Accordingly, when using a transistor having a channel layer formed of an oxide semiconductor, realizing an inverter having both an n-channel transistor and a p-channel transistor may be difficult.

SUMMARY

Example embodiments include an enhancement/depletion (E/D) mode inverter. Other example embodiments include a method of operating the inverter. Example embodiments include a logic circuit including the inverter.

Additional aspects will be set forth in part in the description which follows and, in part, will be apparent from the description, or may be learned by practice of example embodiments.

According to example embodiments, an inverter may include a load transistor; and a driving transistor connected to the load transistor, wherein at least one of the load transistor and the driving transistor has a double gate structure that adjusts the threshold voltage of the load transistor or the driving transistor.

The load transistor may be a depletion mode transistor, and the driving transistor may be an enhancement mode transistor having the double gate structure. The load transistor may be a depletion mode transistor having the double gate structure, and the driving transistor may be an enhancement mode transistor. The load transistor and the driving transistor may be oxide thin film transistors (TFTs).

Channel layers of the load transistor and the driving transistor may include a ZnO-based oxide. The load transistor and the driving transistor may be a top gate transistor, and one of the load transistor and the driving transistor may further include a bottom gate under the top gate transistor. Each of the load transistor and the driving transistor may include an active layer having a channel region, a source region, and a drain region.

Each of the load transistor and the driving transistor may include a channel layer, a source layer contacting a first end of the channel layer, and a drain layer contacting a second end of the channel layer. Each of the load transistor and the driving transistor may be a bottom gate transistor, and one of the load transistor and the driving transistor may further include a top gate above the bottom gate transistor. The two gates of the double gate structure in either the load transistor or the driving transistor may be separated from each other. The two gates of the double gate structure in either the load transistor or the driving transistor may be electrically connected to each other. The load transistor and the driving transistor may have the double gate structure.

According to example embodiments, a logic circuit may include a plurality of the inverters of example embodiments. The load transistor and the driving transistor of each of the plurality of inverters may be a top gate transistor, and one of the load transistor and the driving transistor may further include a bottom gate below the top gate transistor, the bottom gate being separated from the corresponding top gate, and the bottom gate of each of the plurality of inverters may be electrically connected to one another.

The load transistor and the driving transistor of each of the plurality of inverters may be a bottom gate transistor, one of the load transistor and the driving transistor may further include a top gate above the bottom gate transistor, the top gate being separated from the corresponding bottom gate, and the top gate of each of the plurality of inverters may be electrically connected to one another. The logic circuit may include at least one of a NAND circuit, a NOR circuit, an encoder, a decoder, a multiplexer (MUX), a demultiplexer (DEMUX), and a sense amplifier. The load transistor and the driving transistor may have the double gate structure.

According to example embodiments, a method of operating the inverter may include providing a load transistor and a driving transistor connected to the load transistor, wherein at least one of the load transistor and the driving transistor has a double gate structure, and varying a threshold voltage of the at least one transistor having the double gate structure.

Varying the threshold voltage may include supplying a voltage to at least one of two gates of the transistor having the double gate structure. The driving transistor may have the double gate structure, and varying the threshold voltage may include supplying a negative (−) voltage to one of two gates of the driving transistor.

The driving transistor may have the double gate structure, and varying the threshold voltage may include supplying a positive (+) voltage to two gates of the driving transistor. The load transistor may have the double gate structure, and varying the threshold voltage may include supplying a positive (+) voltage to one of two gates of the load transistor. The method may further include supplying a normal operational voltage to the inverter after adjusting the threshold voltage. The load transistor and the driving transistor may have the double gate structure.

BRIEF DESCRIPTION OF THE DRAWINGS

Example embodiments will be more clearly understood from the following detailed description taken in conjunction with the accompanying drawings.

FIGS. 1 through 6 are cross-sectional views of an inverter according to example embodiments;

FIG. 7 is a circuit diagram of an inverter according to example embodiments;

FIG. 8 is a graph illustrating variations in a gate voltage (Vg)-drain current (Id) according to the other gate voltage of a double gate transistor included in an inverter according to example embodiments;

FIG. 9 is a graph illustrating variations in a gate voltage (Vg)-drain current (Id) of a double gate transistor included in an inverter according to example embodiments;

FIG. 10 is a graph illustrating variations in a gate voltage (Vg)-drain current (Id) of a single gate transistor according to a comparative example;

FIG. 11 is a graph illustrating gate voltage (Vg)-drain current (Id) characteristics of a load transistor included in an inverter according to example embodiments;

FIG. 12 is a graph illustrating gate voltage (Vg)-drain current (Id) characteristics of a driving transistor included in an inverter according to example embodiments;

FIG. 13 is a graph illustrating input voltage (VI)-output voltage (VO) characteristics of an inverter according to example embodiments; and FIGS. 14 through 16 are cross-sectional views illustrating an inverter according to example embodiments.

Figure 1:
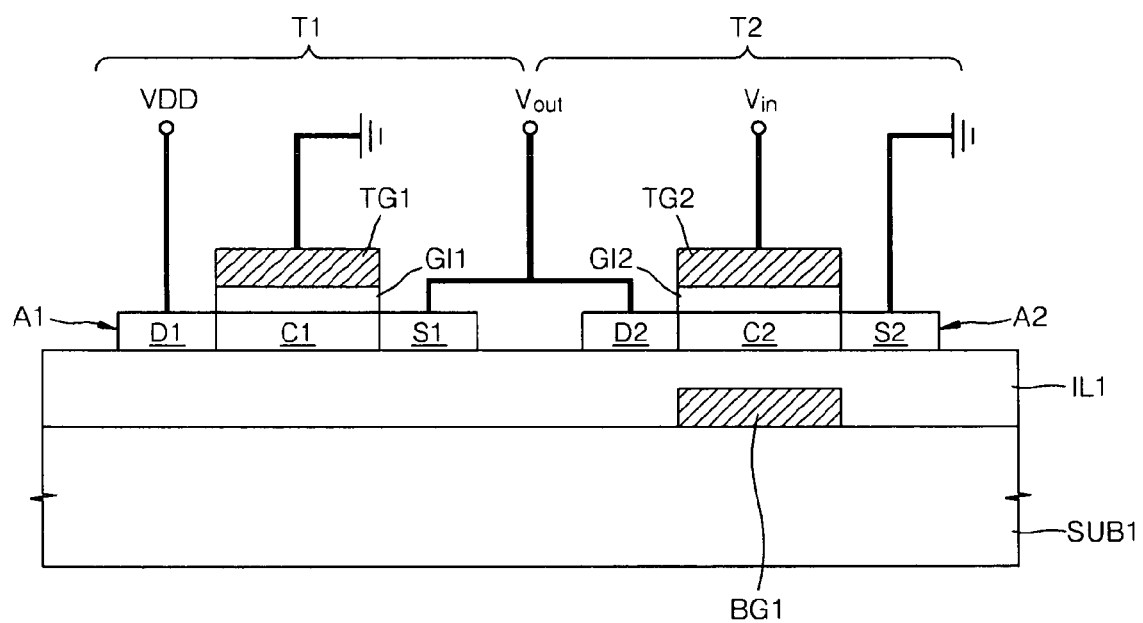
FIGS. 1-16 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown. Detailed illustrative example embodiments are disclosed herein. However, specific structural and functional details disclosed herein are merely representative for purposes of describing example embodiments. Example embodiments may, however, be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

Spatially relative terms, e.g., "beneath," "below," "lower," "above," "upper" and the like, may be used herein for ease of description to describe one element or feature's relationship to another element(s) pr feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Example embodiments relate to a transistor, an inverter including the transistor, a logic circuit including the inverter, and methods of manufacturing the same. In the drawings, the thicknesses of layers and regions are exaggerated for clarity. Like reference numerals in the drawings denote like elements.

FIG. 1 is a cross-sectional view of an inverter according to example embodiments. Referring to FIG. 1, a load transistor T1 and a driving transistor T2 electrically connected to each other may be formed on a substrate SUB1. At least one of the load transistor T1 and the driving transistor T2 may have a double gate structure. In example embodiments, the driving transistor T2 may have a double gate structure. The load transistor T1 may be a depletion-mode transistor, and the driving transistor T2 may be an enhancement-mode transistor. When a gate voltage is about 0 V, the depletion-mode transistor may be turned 'on', which means that a measurable current flows. On the other hand, an enhancement-mode transistor may be turned 'off' when a gate voltage is about 0 V. Accordingly, a threshold voltage of the depletion-mode transistor may be smaller than about 0 V, and a threshold voltage of the enhancement-mode transistor may be greater than about 0 V.

In detail, a bottom gate BG1 may be formed on a substrate SUB1, and an insulating layer IL1 covering the bottom gate BG1 may be formed. A top surface of the insulating layer IL1 may be planar, and a first active layer A1 and a second active layer A2 separated from each other may be formed on the insulating layer IL1. The second active layer A2 may be formed above the bottom gate BG1. The first and second active layers A1 and A2 may include an oxide semiconductor, e.g., ZnO-based oxide semiconductor, for example, ZnO, InZnO, GaInZnO, and ZnSnO, and may further include additional elements, for example, at least one of a Group II element, e.g., Mg, at least one of a Group III element, e.g., Y or La, at least one of a Group IV element, e.g., Ti, Hf or Zr, at least one of a Group V element, e.g., Ta, at least one of a Group VI element, e.g., Cr, at least one of a Group XII element, e.g., Cd, at least one of a Group XIII element, e.g., Al or Ga, and at least one of a Group XV element, e.g., N. However, the material for the first and second active layers A1 and A2 is not limited to oxides. In other words, the first and second active layers A1 and A2 may also be non-oxide layers.

A first source region S1 and a first drain region D1 may be formed on both ends of the first active layer A1. The first source region S1 and the first drain region D1 may be plasma-treated regions. For example, when the two ends of the first active layer A1 are treated with a single element gas plasma (e.g., argon (Ar) plasma, xenon (Xe) plasma, hydrogen (H) plasma, or a plasma of gas containing H) or with a mixed gas plasma (e.g., a plasma of mixed gas of $SF_6$ and $O_2$), the two ends of the first active layer A1 may become conductive and may be formed as the first source region S1 and the first drain region D1. However, the first source region S1 and the first drain region D1 may also be formed by implanting conductive impurities into the two ends of the first active layer A1 instead of treating them with plasma or in addition to the plasma treatment. A portion of the first active layer A1 between the first source region S1 and the first drain region D1 may be a first channel region C1.

Similarly, the second active layer A2 may have a second channel region C2, a second source region S2, and a second drain region D2. Although not illustrated in FIG. 1, each of the first source region S1 and the first drain region D1 may include a first conductive region having higher electric conductivity and a second conductive region having lower electric conductivity formed between the first conductive region and the first active layer A1. That is, the first source region S1 and the first drain region D1 may have a similar structure to a lightly doped drain (LDD) structure. Also, the second source region S2 and the second drain region D2 may have a similar structure to the LDD structure. Also, at least one other insulating layer may be further formed between one of the first and second active layers A1 and A2 and the insulating layer IL1. In addition, the first and second active layers A1 and A2 may be formed as a non-separate, single unit layer, and in example embodiments, the first source region S1 and the second drain region D2 may be formed to contact each other.

A first gate insulating layer GI1 and a first top gate TG1 may be formed on the first channel region C1, and also, a second gate insulating layer GI2 and a second top gate TG2 may be formed on the second channel region C2. Accordingly, the driving transistor T2 may be a double gate structure having the bottom gate BG1 and the top gate TG2 on both sides of the second channel region C2. In the driving transistor T2, the second channel region C2, the second source region S2, the second drain region D2, the second gate insulating layer GI2, and the second top gate TG2 form a top gate thin film transistor (TFT). Accordingly, the driving transistor T2 may be a double gate TFT having a bottom gate BG1 under a top gate TFT. The bottom gate BG1 may be separated from the second top gate TG2 or electrically connected to the second top gate TG2. The bottom gate BG1 and the second top gate TG2 may be connected to each other via a conductive plug (not shown).

A power source VDD may be connected to the first drain region D1, and an input terminal Vin may be connected to the second top gate TG2. The source region and the second drain region D2 may be commonly connected to an output terminal Vout, and the first top gate TG1 and the second source region S2 may be grounded. The first top gate TG1 may be connected to the output terminal Vout instead of being grounded.

The driving transistor T2 may have a double gate structure and thus may be an enhancement mode transistor. In detail, in the driving transistor T2, a top gate TFT formed of the top channel region C2, the second source region S2, the second drain region D2, the second gate insulating layer GI2, and the second top gate TG2 may be a depletion mode transistor, but the driving transistor T2 may be an enhancement mode transistor due to a voltage applied to the bottom gate BG1 formed below the top gate TFT. For example, when a predetermined or given negative (−) voltage is supplied to the bottom gate BG1, electrons in the second channel region C2 may be reduced, that is, a depletion region may be formed in the second channel region C2, and forming an n-channel in the second channel region C2 may be difficult.

The threshold voltage may be increased; in other words, when a predetermined or given negative (−) voltage is applied to the bottom gate BG1, a relatively large voltage needs to be applied to the second top gate TG2 in order to form an n-channel in the second channel region C2, compared to when a negative voltage is not applied. Accordingly, the driving transistor T2 may be an enhancement mode transistor having a threshold voltage that is greater than about 0 V. When no voltage is applied to the bottom gate BG1, the driving transistor T2 may be a depletion mode transistor; however, because the driving transistor T2 is used as an enhancement mode transistor during an actual operation, the driving transistor T2 of example embodiments is referred to as an enhancement mode transistor. In general, when a channel layer is formed of an oxide semiconductor, realizing an enhancement mode transistor may be difficult. However, in example embodiments, an enhancement mode transistor having an oxide channel layer may be more easily formed by using a double gate structure.

In addition, when a predetermined or given positive (+) voltage is applied to the bottom gate BG1 and the second top gate TG2, the threshold voltage of the driving transistor T2 may be increased by the positive (+) voltage. Regarding the mechanism of increasing the threshold voltage of the driving transistor T2, electrons may be trapped in a portion of the insulating layer IL1 between the bottom gate BG1 and the second channel region C2, that is, in a gate insulating layer, by the positive (+) voltage applied to the bottom gate BG1. Similarly, electrons may be trapped in the second gate insulating layer GI2 by the positive (+) voltage applied to the second top gate TG2, and forming an n-channel in the second channel region C2 may be difficult due to the trapped electrons. However, the threshold voltage may also be increased due to other factors. As described above, when the threshold voltage of the driving transistor T2 is increased by applying a positive (+) voltage to the bottom gate BG1 and the second top gate TG2, after increasing the threshold voltage, a normal operational voltage may be applied to one of the bottom gate BG1 and the second top gate TG2, for example, to the second top gate TG2, to normally operate the inverter. In a normal operation, the intensity of the voltage applied to the second top gate TG2 may be smaller than a voltage\ applied to the bottom gate BG1 and the second top gate TG2 to increase the threshold voltage.

The load transistor T1 may be a depletion mode transistor. Accordingly, the inverter according to example embodiments may be an enhancement/depletion (E/D) mode inverter. The E/D mode inverter may have improved operational characteristics compared with an inverter having a depletion mode load transistor and a depletion mode driving transistor.

Figure 2:
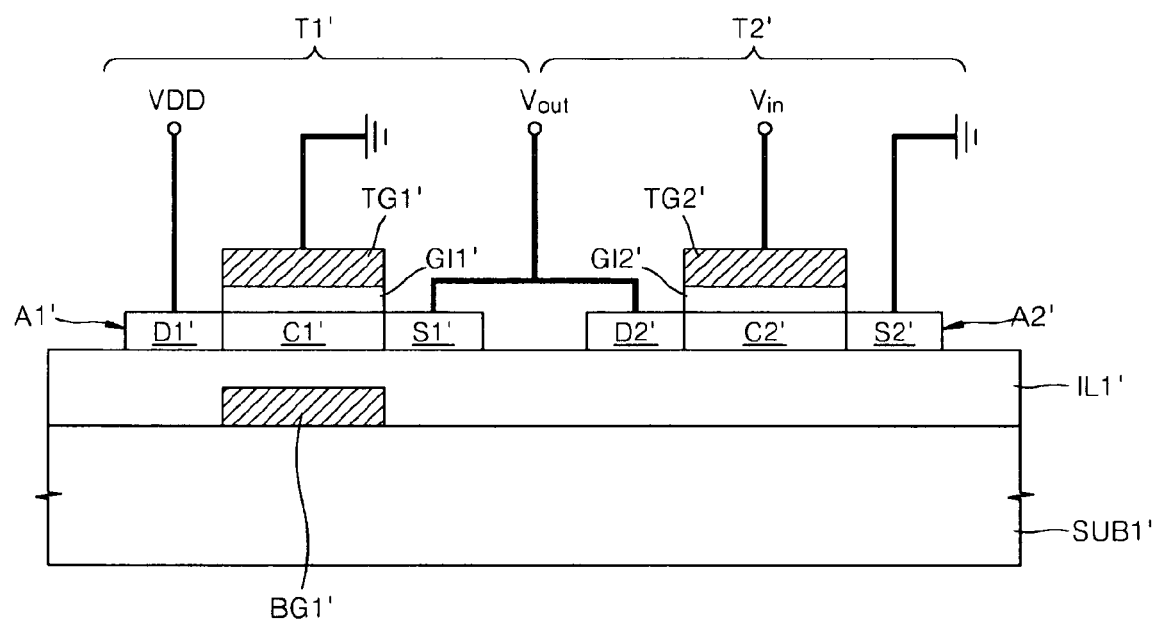

FIG. 2 is a cross-sectional view of an inverter according to example embodiments. Referring to FIG. 2, a bottom gate BG1' may be disposed below a first channel region C1'. Accordingly, a load transistor T1' has a double gate structure, and a driving transistor T2' has a single gate structure. The structure of the inverter of FIG. 2 may be the same as that of the inverter of FIG. 1 except for the position of the bottom gate BG1'. In FIG. 2, reference numerals SUB1', IL1', A1', A2', S1', S2', D1, D2', GI2', TG1', and TG2' denote a substrate, an insulating layer, a first active layer, a second active layer, a first source region, a second source region, a first drain region, a second drain region, a first gate insulating layer, a second gate insulating layer, a first top gate, and a second top gate, respectively. The first and second active layers A1' and A2' may be formed of different materials and/or by using a different process than the first and second active layers A1 and A2 of the inverter of FIG. 1.

Regarding the first and second active layers A1' and A2' being formed of different materials and/or using a different process than the first and second active layers A1 and A2 of the inverter of FIG. 1, the load transistor T1 of FIG. 1 is a depletion mode transistor, but the driving transistor T2' of FIG. 2 which has a similar structure to the load transistor T1 of FIG. 1 is an enhancement mode transistor. In detail, when a channel layer is formed of a ZnO-based material layer that is deposited under a high oxygen partial pressure, or is formed of Ga-rich GaInZnO or Hf-rich HfInZnO, an enhancement mode single gate TFT may be realized. Also, when the top gate TFT is formed on the second channel region C2, the driving transistor T2 of FIG. 1 including the second source region S2, the second drain region D2, the second insulating layer GI2, and the top gate TG2 is a depletion mode transistor. When the top gate TFT is formed on the first channel region C1', the load transistor T1' of FIG. 2 includes the first source region S1', the first drain region D1, the first gate insulating layer GI1', and the first top gate TG1' is an enhancement mode transistor.

In FIG. 1, the driving transistor T2 may become an enhancement mode transistor by the bottom gate BG1, and in FIG. 2 the load transistor T1' may become a depletion mode transistor by the bottom gate BG1'. In detail, when a predetermined or given positive (+) voltage is applied to the bottom gate BG1', electrons may be increased in the first channel region C1', and thus the threshold voltage may be reduced. Accordingly, the load transistor T1' may be a depletion mode transistor having a threshold voltage smaller than about 0 V. The first top gate TG1' may be grounded or connected to the output terminal Vout, and thus, the first top gate TG1' and the bottom gate BG1' may be separated from each other. As described above, in FIG. 2, the load transistor T1' may be a depletion mode transistor and the driving transistor T2' may be an enhancement mode transistor, and the inverter including the load transistor T1' and the driving transistor T2' may be an E/D mode inverter like the inverter of FIG. 1. The structure of the inverters of FIGS. 1 and 2 may be modified in various ways. Other examples of the modified inverter are illustrated in FIGS. 3-6.

Figure 3:
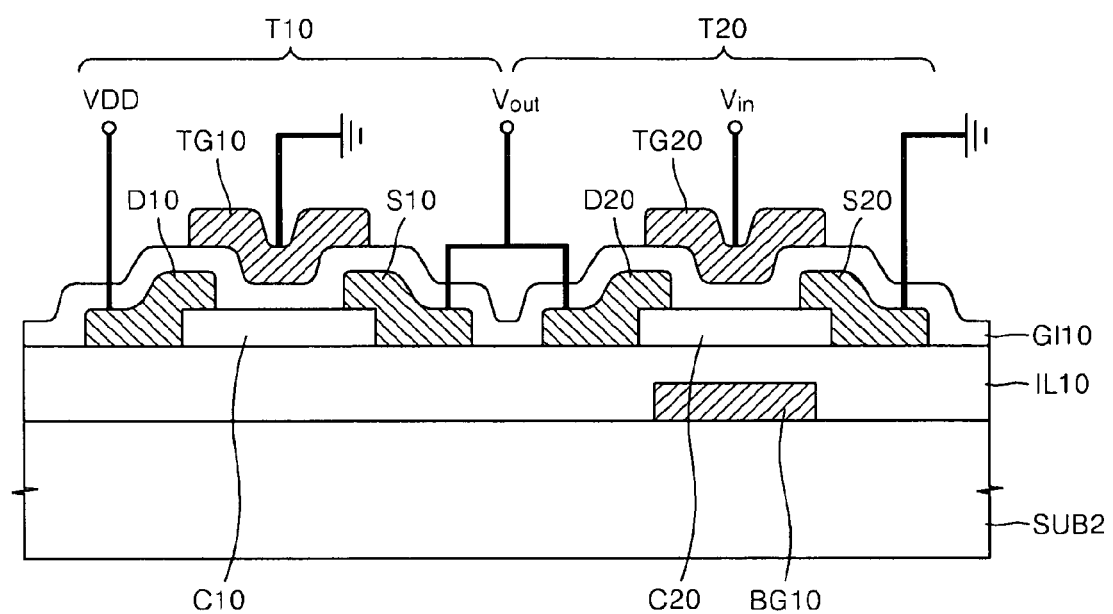

FIG. 3 is a cross-sectional view of an inverter according to example embodiments. Referring to FIG. 3, a bottom gate BG10 and an insulating layer 110 covering the bottom gate BG10 may be disposed on a substrate SUB2. A first channel layer C10, a first source layer S10 and a first drain layer D10 contacting both ends of the first channel layer C10 may be, formed on the insulating layer IL10. A second channel layer C20, a second source layer S20 and a second drain layer D20 contacting both ends of the second channel layer C20 may be formed on the insulating layer IL10 above the bottom gate BG10, being separated from the first channel layer C10. The first and second channel layers C10 and C20 may respectively correspond to the first and second channel regions C1 and C2 of FIG. 1, and may be formed of similar materials to those of the first and second channel regions C1 and C2 of FIG. 1. In FIGS. 1 and 2, the channel regions C1, C1', C2, and C2', the source regions S1, S1', S2, and S2', and the drain regions D1, D1', D2, D2' may be formed in one active layer A1, A1', A2, and A2'. However, in FIG. 3, the channel layers C10 and C20, the source layers S10 and S20 and the drain layers D10 and D20 may be formed respectively. The first source layer S10 and the second drain layer D20 may be separated or may also be formed as a single layer.

A gate insulating layer GI10 covering the first channel layer C10, the first source layer S10, the first drain layer D10, the second channel layer C20, the second source layer S20, and the second drain layer D20 may be formed on the insulating layer IL10. A first top gate TG10 corresponding to the first channel layer C10 and a second top gate TG20 corresponding to the second channel layer C20 may be formed on the gate insulating layer GI10. The second top gate TG20 may be separated from the bottom gate BG10 or may be electrically connected to the bottom gate BG10. A single gate transistor illustrated on the left side of FIG. 3 is a load transistor T10, and a double gate transistor illustrated on the right side of FIG. 3 is a driving transistor T20. The structure and function of the inverter of FIG. 3 is almost the same as the inverter of FIG. 1. In other words, in FIG. 3, because the driving transistor T20 has two gates, the bottom gate BG10 and the top gate TG20, the driving transistor T20 may be an enhancement mode transistor, and the load transistor T10 may be a depletion mode transistor.

Figure 4:
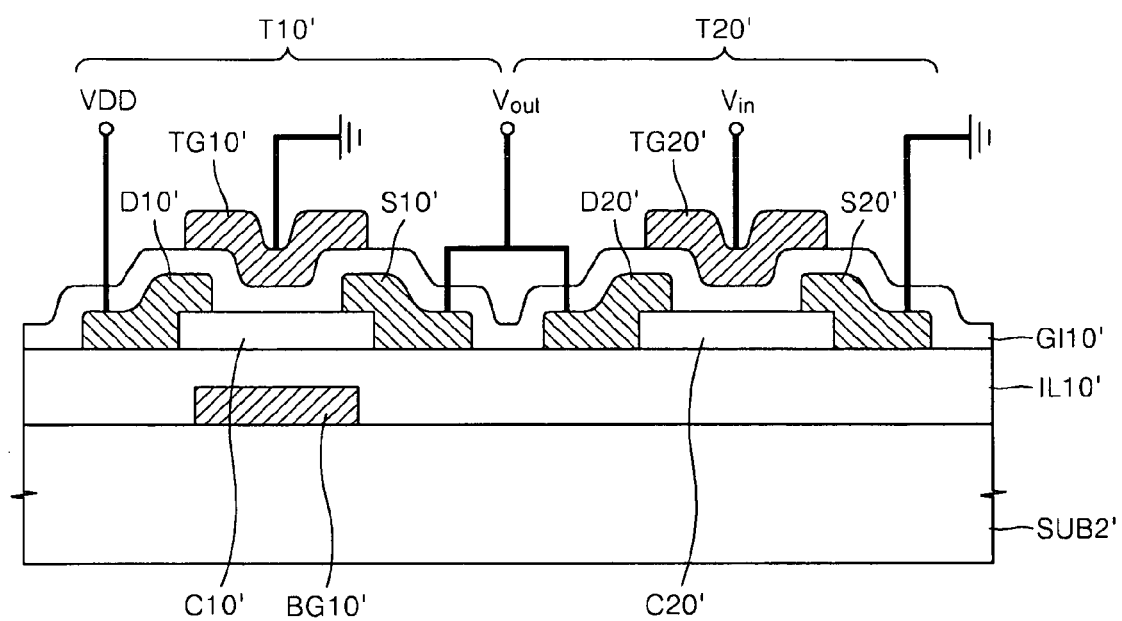

Like the structure of the inverter of FIG. 1, which was modified as the inverter of FIG. 2, the structure of the inverter of FIG. 3 may be modified like an inverter of FIG. 4 as follows. Referring to FIG. 4, a bottom gate BG10' may be disposed below a first channel layer C10'. Accordingly, a load transistor T10' has a double gate structure, and a driving transistor T20' has a single gate structure. The inverter of FIG. 4 has the same structure as the inverter of FIG. 3 except the position of the bottom gate BG10'. In FIG. 4, reference numerals SUB2', IL10', C10', C20', S10', S20', D10', D20', GI10', TG10', and TG20' denote a substrate, an insulating layer, a first channel layer, a second channel layer, a first source layer, a second source layer, a first drain layer, a second drain layer, a gate insulating layer, a first top gate, and a second top gate, respectively.

The first and second channel layers C10' and C20' may be formed of different materials and/or different processes than those of the first and second channel layers C10 and C20 of FIG. 3. Considering that the first and second channel layers C10' and C20' are formed of different materials and/or different processes, when the load transistor T10 of FIG. 2 is a depletion mode transistor, the driving transistor T20' of FIG. 4 having a similar structure to the load transistor T10 of FIG. 3 may be an enhancement mode transistor. Also, the top gate TFT formed of the second channel layer C20, the second source layer S20, the second drain layer D20, the gate insulating layer GI10, and the second top gate TG20 in the driving transistor T20 of FIG. 3, is a depletion mode transistor, whereas the top gate TFT formed of the first channel layer C10', the first source layer S10', the first drain layer D10', the gate insulating layer GI10', and the first top gate TG10' in the load transistor T10' of FIG. 4 may be an enhancement mode transistor.

While the driving transistor T20 becomes an enhancement mode transistor due to the bottom gate BG10 in FIG. 3, the load transistor T10' in FIG. 4 may become a depletion mode transistor due to the bottom gate BG10'. In detail, when a predetermined or given positive (+) voltage is applied to the bottom gate BG10', the concentration of electrons may increase in the first channel layer C10', and thus, a threshold voltage may be reduced. Accordingly, the load transistor T10' may be used as a depletion mode transistor. Because the first top gate TG10' is grounded or connected to the output terminal Vout, the first top gate TG10' and the bottom gate BG10' may be separated.

The inverters according to the above-described example embodiments respectively include two top gate TFTs, and a bottom gate may be disposed below one of the two top gate TFTs. According to example embodiments, an inverter may include two bottom gate TFTs, wherein a top gate may be disposed on one of the two bottom gate TFTs, as illustrated in FIGS. 5 and 6.

Figure 5:
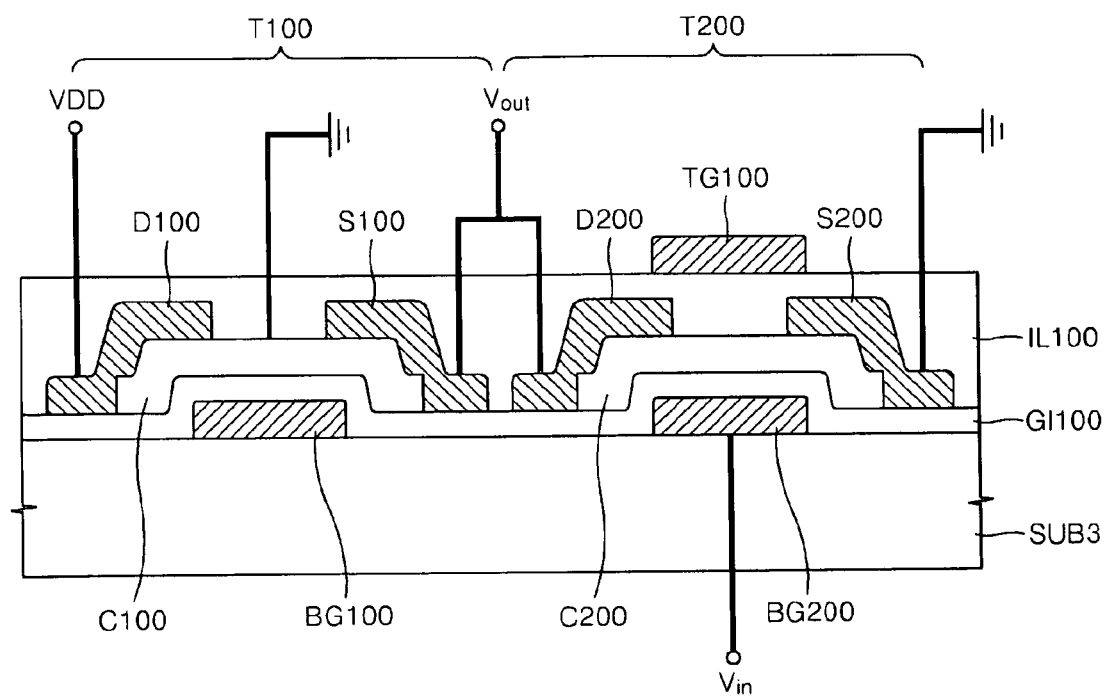

Referring to FIG. 5, a load transistor T100 may be a single gate transistor having a bottom gate structure. A driving transistor T200 may be a double gate transistor having a top gate TG100 formed on a transistor having a bottom gate structure. In FIG. 5, reference numerals SUB3, BG100, BG200, GI100, C100, C200, S100, S200, D100, D200, and IL100 denote a substrate, a first bottom gate, a second bottom gate, a gate insulating layer, a first channel layer, a second channel layer, a first source layer, a second source layer, a first drain layer, a second drain layer, and an insulating layer, respectively. The first and second channel layers C100 and C200 may be similar material layers as the first and second channel layers C10 and C20 of FIG. 3, respectively. The load transistor T100 may be a depletion mode transistor and the driving transistor T200 may be an enhancement mode transistor. The principle that the driving transistor T200 becomes an enhancement mode transistor is similar to that described with reference to FIG. 3.

Figure 6:
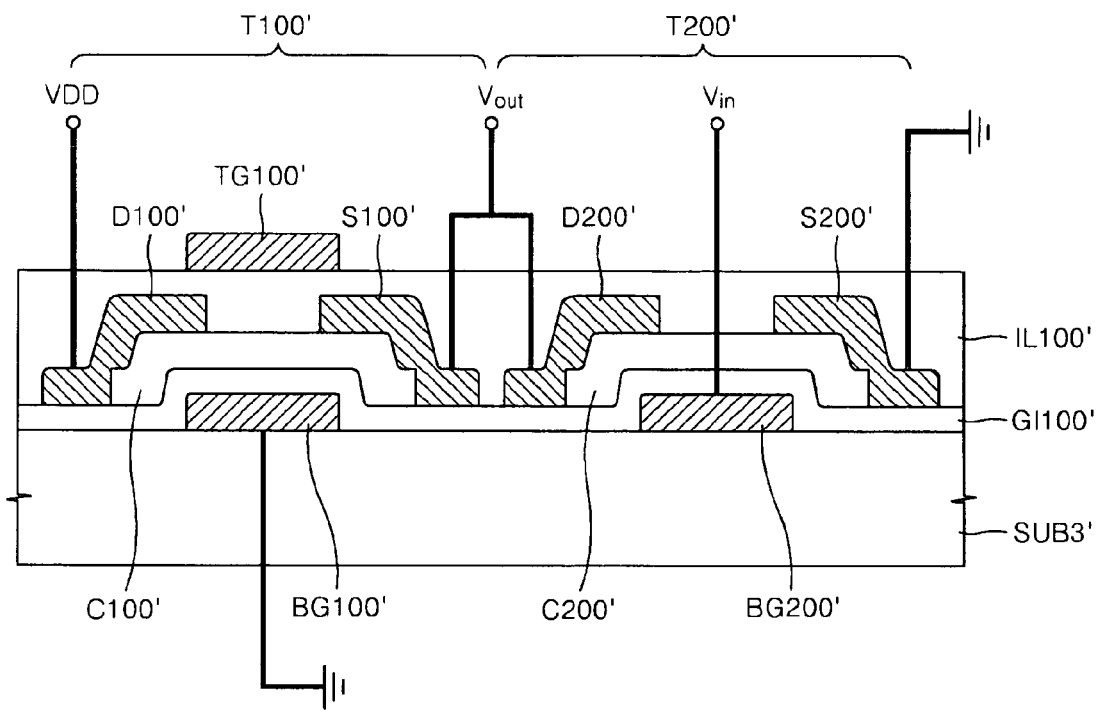

Referring to FIG. 6, a top gate TG100' may be disposed above a first channel layer C100'. Accordingly, a load transistor T100' has a double gate structure, and a driving transistor T200' has a single gate structure. The structure of the inverter of FIG. 6 is the same as the inverter of FIG. 5 except for the position of the top gate TG100'. In FIG. 6, reference numerals SUB3', BG100', BG200', GI100', C200', S100', S200', D100', D200', and IL100' denote a substrate, a first bottom gate, a second bottom gate, a gate insulating layer, a second channel layer, a first source layer, a second source layer, a first drain layer, a second drain layer, and an insulating layer, respectively. The first and second channel layers C100' and C200' may be similar material layers as the first and second channel layers C10' and C20' of FIG. 4. The load transistor T100' may be a depletion mode transistor, and the driving transistor T200' may be an enhancement mode transistor. The principle that the load transistor T100' becomes a depletion mode transistor is similar to that described with reference to FIG. 4.

Figure 7:
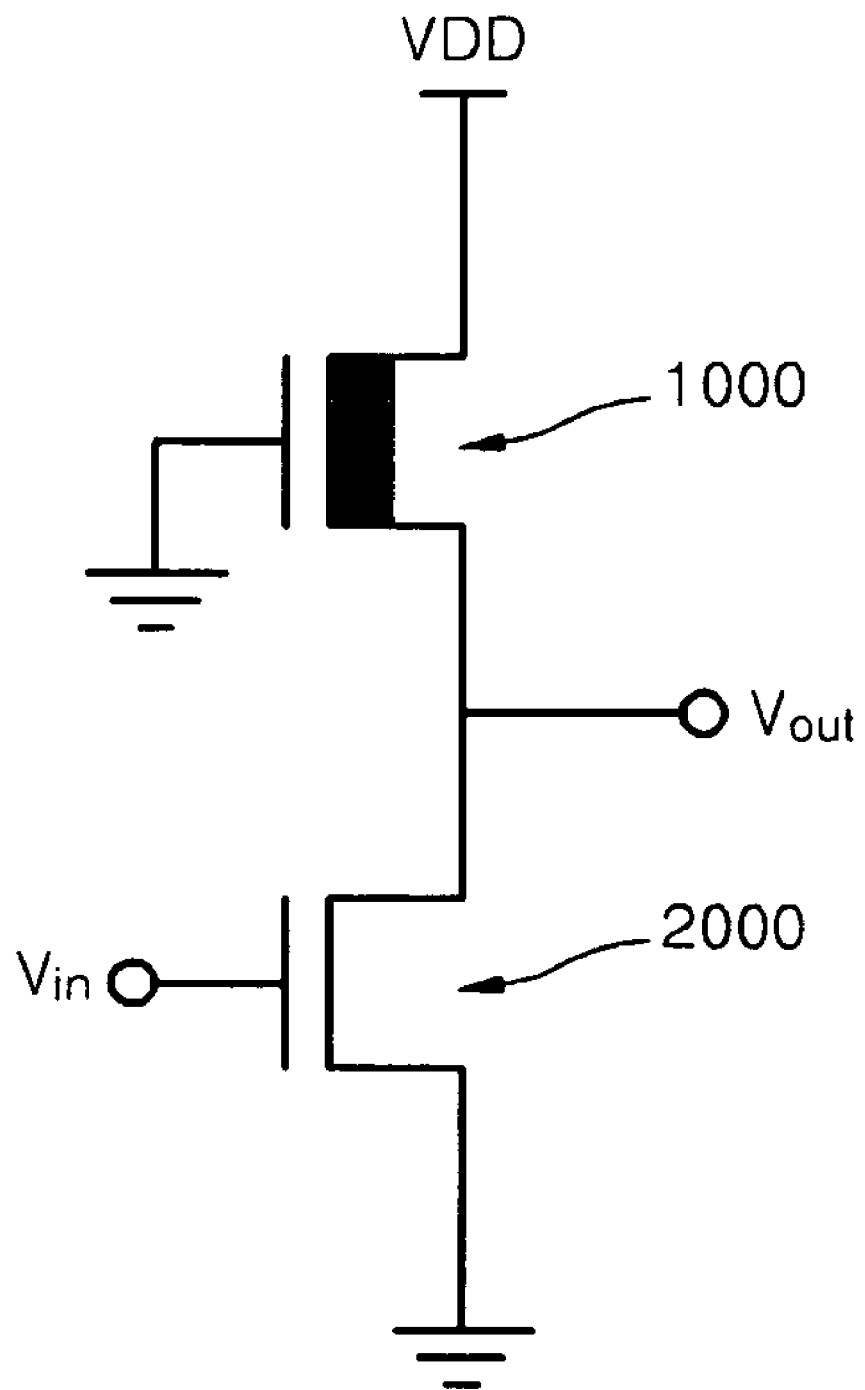

The inverters of FIGS. 1 through 6 may also be illustrated by a circuit diagram as shown in FIG. 7. FIG. 7 is a representative circuit diagram of inverters according to example embodiments. One of a load transistor 1000 and a driving transistor 2000 may have a double gate structure, and only one of the two gates is illustrated for convenience of description.

Referring to FIG. 7, the depletion mode load transistor 1000 and the enhancement mode driving transistor 2000 may be connected. A power source VDD may be connected to a drain of the load transistor 1000, an input terminal Vin may be connected to a gate of the driving transistor 2000, and an output terminal Vout may be commonly connected to a source of the load transistor 1000 and a drain of the driving transistor 2000. A source of the driving transistor 2000 and a gate of the load transistor 1000 may be grounded. A gate of the load transistor 1000 may be connected to the output terminal Vout instead of being grounded.

When a voltage of about 0 V is applied to the input terminal Vin, that is, when the driving transistor 2000 is turned off, and a high level power voltage is applied to the drain of the load transistor 1000 via the power source VDD, a high level voltage may be detected at the output terminal Vout. While the power voltage is continuously applied to the drain of the load transistor 1000, and a voltage greater than a threshold voltage is applied to the input terminal Vin to turn on the driving transistor 2000, most of the current flows to the ground through the driving transistor 2000. Accordingly, a low level voltage may be detected at the output terminal Vout. That is, while the power voltage is fixed, the voltage output to the output terminal Vout may be varied according to the voltage applied to the input terminal Vin.

Figure 8:
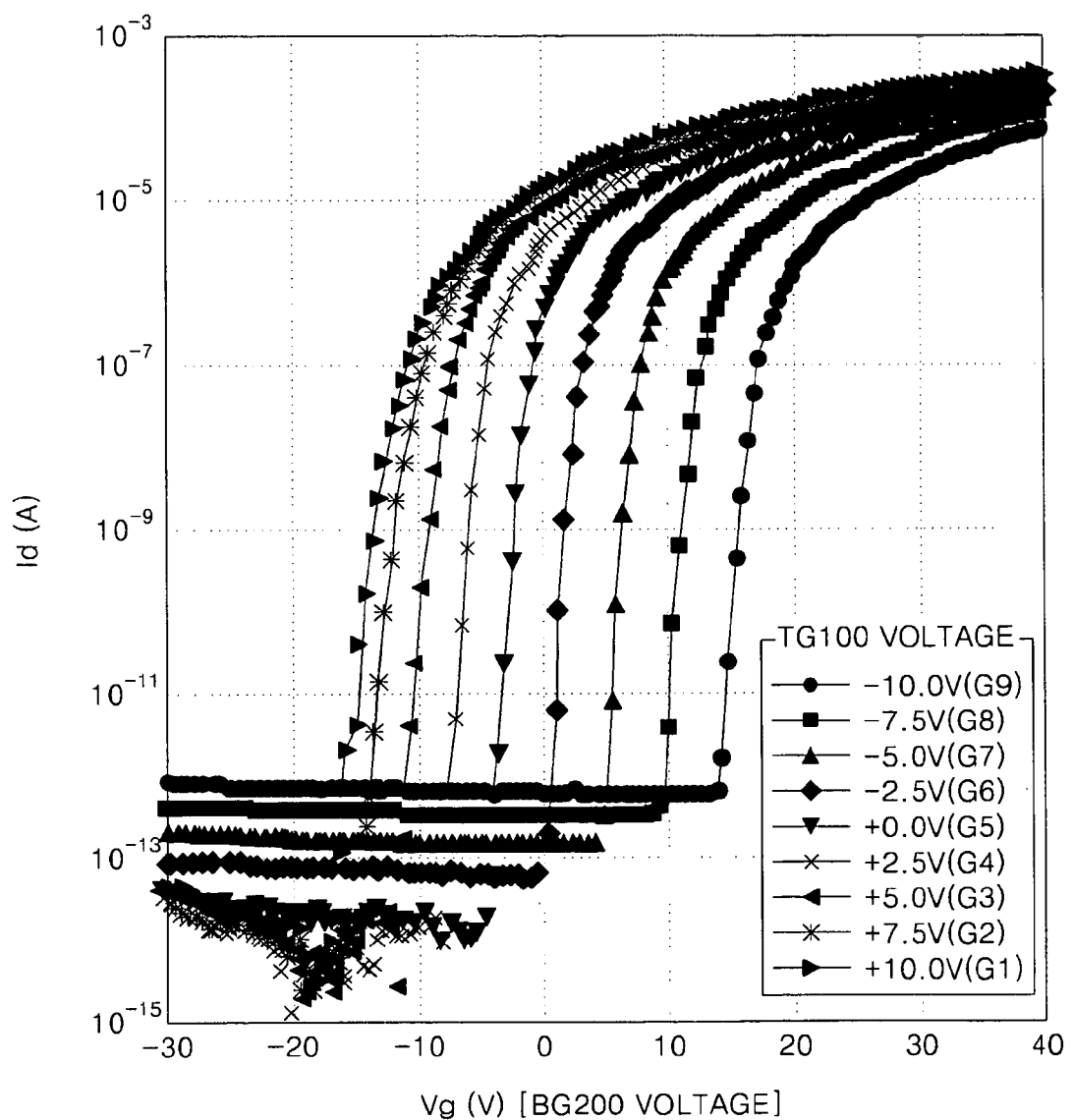

FIG. 8 is a graph illustrating variations in gate voltage (Vg)-drain current (Id) characteristics according to the other gate voltage of a double gate transistor included in an inverter according to example embodiments. The transistor with which the result of FIG. 8 is obtained has the structure of the driving transistor T200 of FIG. 5. A top gate TG100 and a second bottom gate BG200 are separated and receive different voltages, respectively. In detail, FIG. 8 shows variations in the drain current Id according to a voltage applied to the second bottom gate BG200 (hereinafter referred to as a second gate voltage Vg) while a predetermined or given voltage (hereinafter referred to as a first gate voltage) is applied to the top gate TG100 of FIG. 5. In FIG. 8, first through ninth graphs G1 through G9 show variations in the drain current Id when the first gate voltages of +10.0V, +7.5V, +5.0V, +2.5V, 0V, −2.5V, −5.0V. −7.5V, and −10.0V are applied to the top gate TG100, respectively.

Referring to FIG. 8, as the first gate voltage is decreased, the graphs move to the right side. As the first gate voltage is decreased, the threshold voltage of the transistor may be moved in a positive (+) direction. Accordingly, when a predetermined or given negative (−) voltage is applied to the top gate TG100, the driving transistor T200 including the top gate TG100 may become an enhancement mode transistor having a positive (+) threshold voltage.

Figure 9:
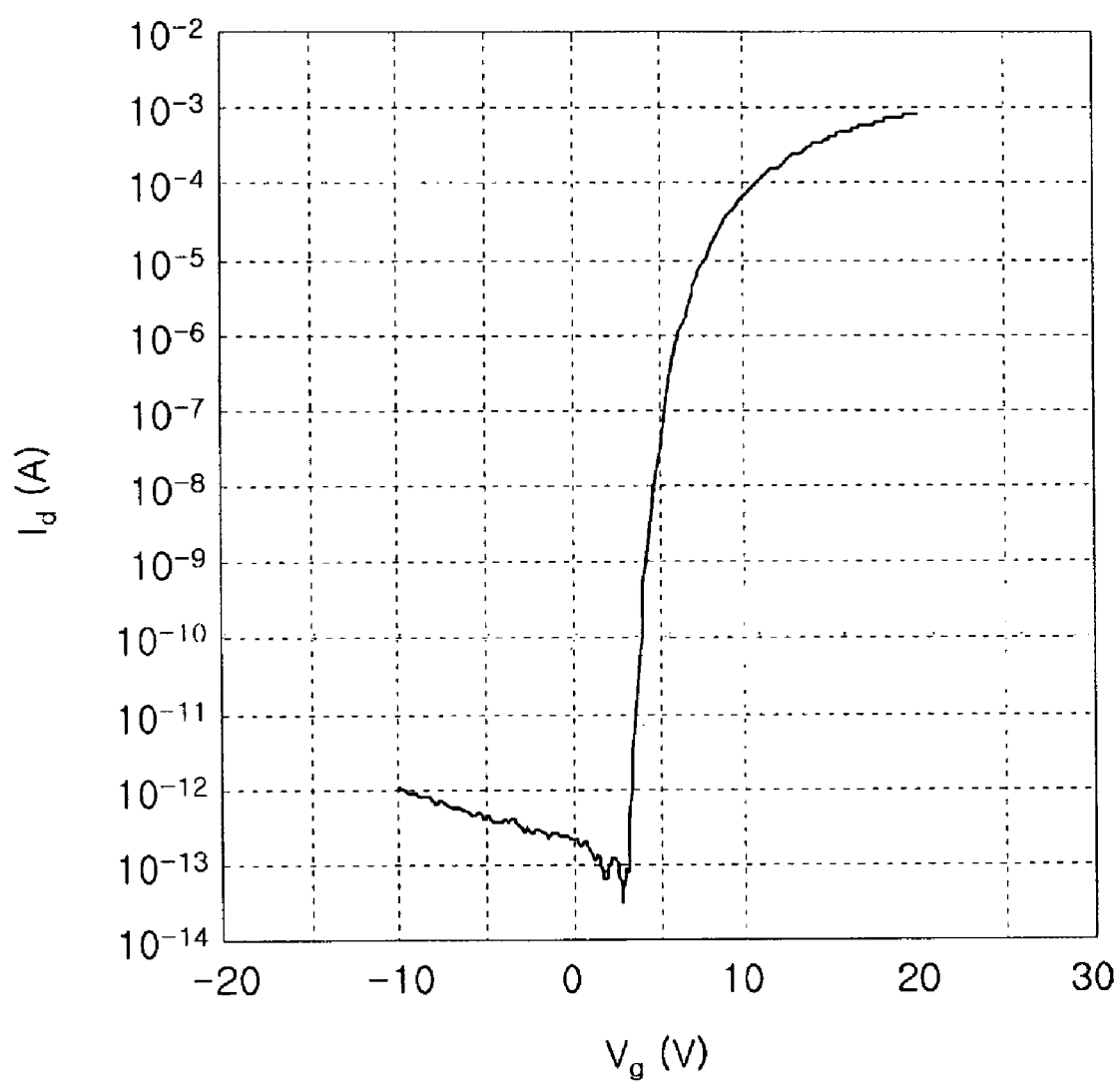

FIG. 9 is a graph illustrating variations in gate voltage (Vg)-drain current (Id) characteristics of a double gate transistor included in an inverter according to example embodiments. The transistor, from which results of FIG. 9 are obtained, includes two gates that are electrically connected to each other, and may have a cross-sectional structure similar to the structure of the driving transistor T200 illustrated in FIG. 5. That is, the transistor used in example embodiments may have the structure of the driving transistor T200 illustrated in FIG. 5, whereas two gates, TG100 and BG200, are connected and receive an identical voltage. Referring to FIG. 9, the double gate transistor according to example embodiments is an enhancement mode transistor having a positive (+) threshold voltage.

Figure 10:
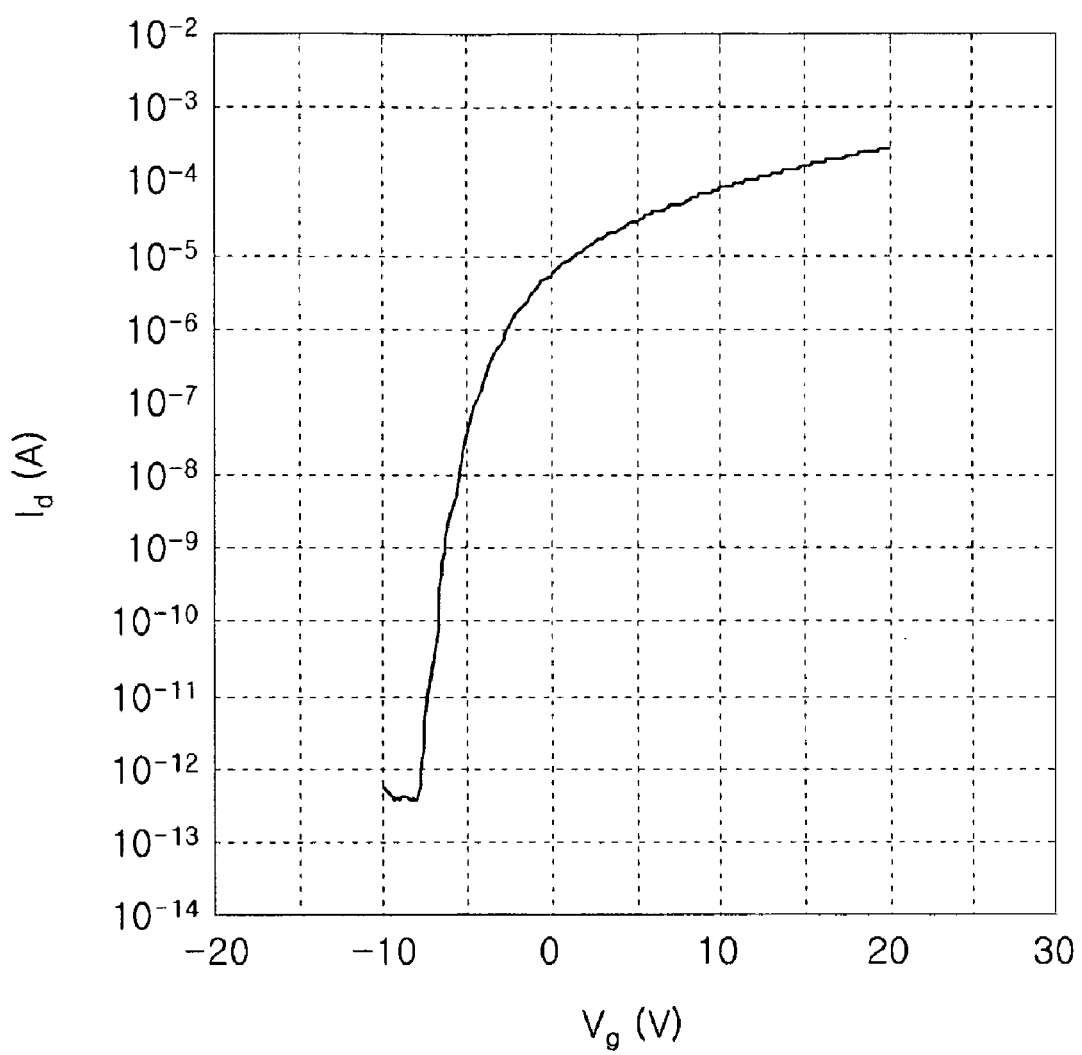

FIG. 10 is a graph illustrating variations in gate voltage (Vg)-drain current (Id) characteristics of a single gate transistor according to a comparative example. In the single gate transistor according to the comparative example, the top gate TG100 of the driving transistor T200 of FIG. 5 is eliminated. Referring to FIG. 10, the single gate transistor of the comparative example is a depletion mode transistor having a threshold voltage smaller than about 0. Accordingly, as shown in FIGS. 9 and 10, when a single gate depletion mode transistor is modified to a double gate transistor and the two gates of the double gate transistor are electrically connected, the transistor may be modified to an enhancement mode transistor.

Figure 11:
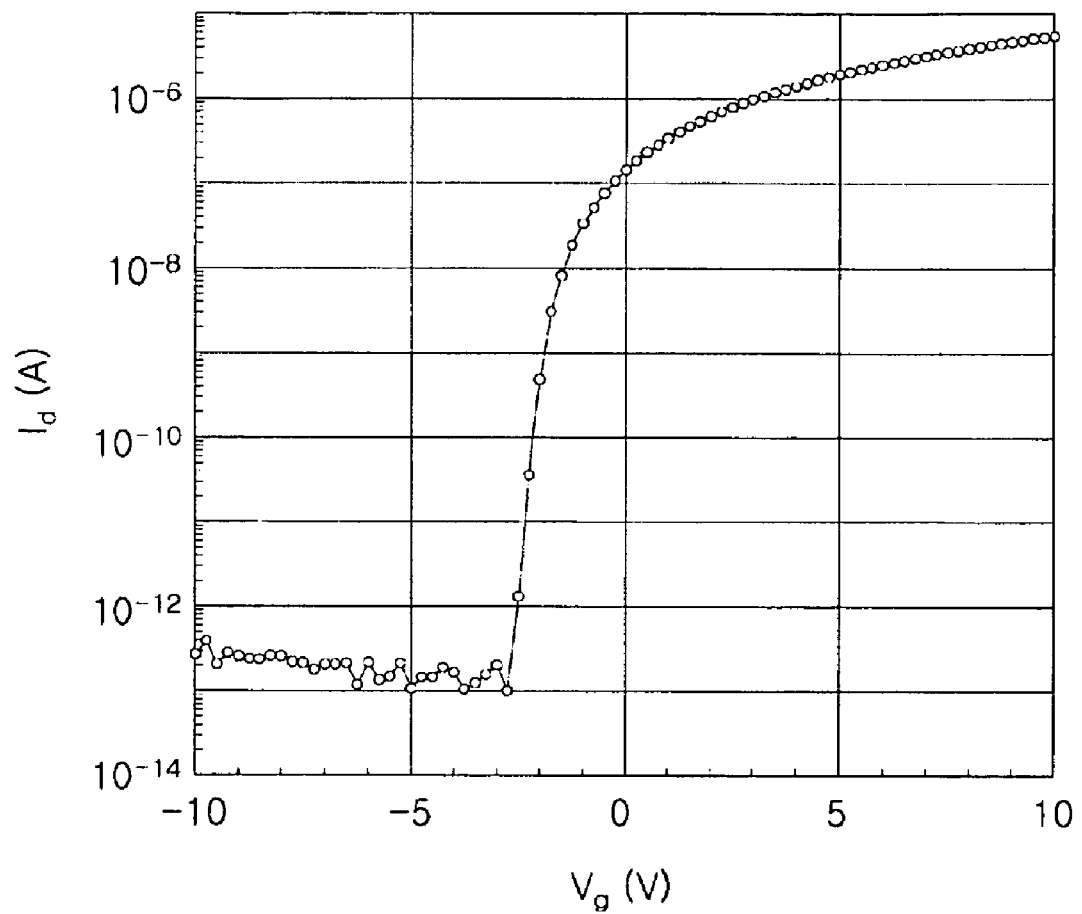

FIG. 11 is a graph illustrating gate voltage (Vg)-drain current (Id) characteristics of a depletion mode load transistor included in an inverter according to example embodiments. The depletion mode load transistor, from which results of FIG. 11 are obtained, has the structure of the load transistor T1 of FIG. 1. Referring to FIG. 11, when a gate voltage Vg is about 0 V, a high level on-current may flow, and the load transistor according to example embodiments is a depletion mode transistor.

Figure 12:
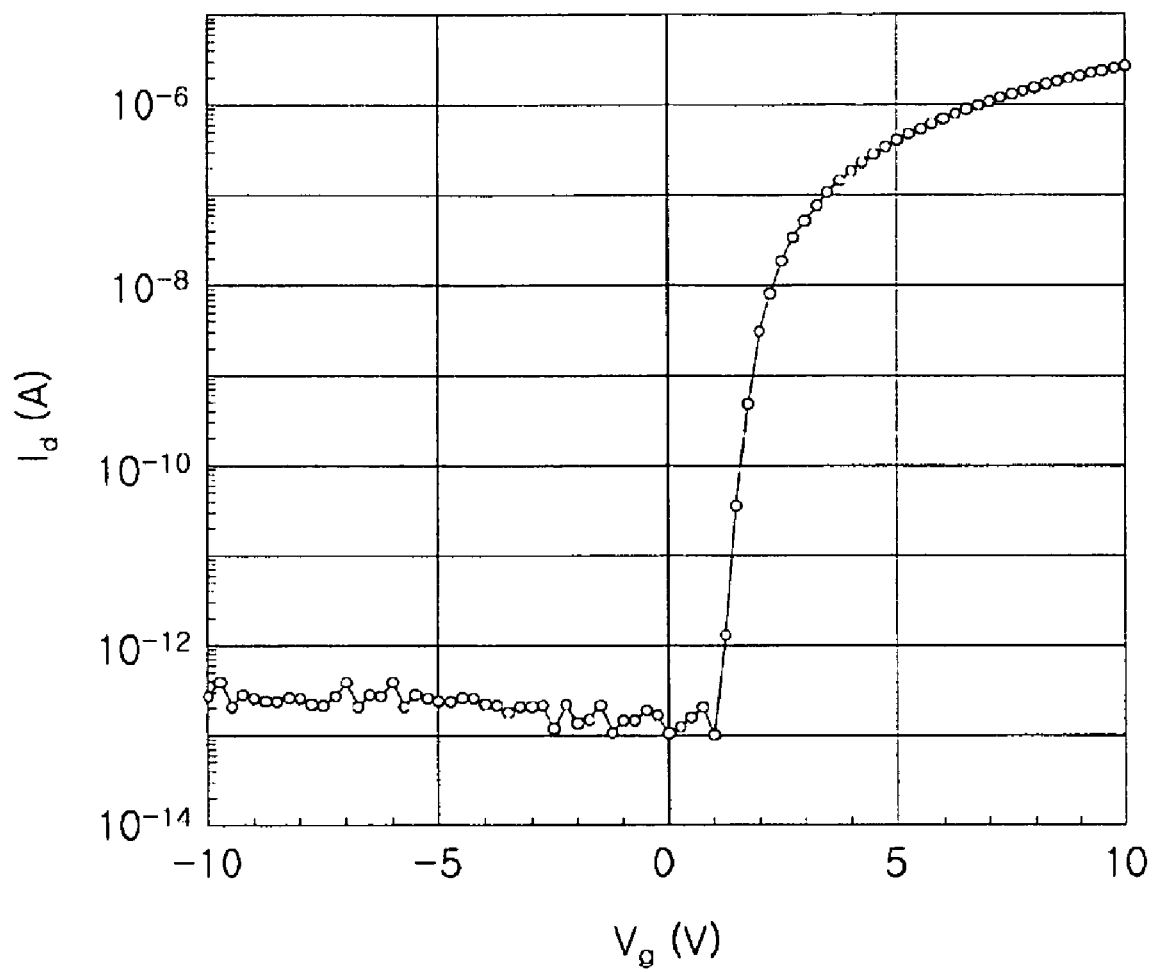

FIG. 12 is a graph illustrating gate voltage (Vg)-drain current (Id) characteristics of an enhancement mode driving transistor included in an inverter according to example embodiments. The enhancement mode driving transistor, from which results of FIG. 12 are obtained, has the structure of the driving transistor T2 of FIG. 1. Referring to FIG. 12, when a gate voltage Vg is about 0 V, a low level off-current may flow, and the driving transistor according to example embodiments is an enhancement mode transistor. The gate voltage Vg may be a voltage applied to the second top gate TG2 of the driving transistor T2 of FIG. 1. While a predetermined or given negative (−) voltage is uniformly applied to the bottom gate BG1 of FIG. 1, the gate voltage Vg may be applied to the second top gate TG2.

Figure 13:
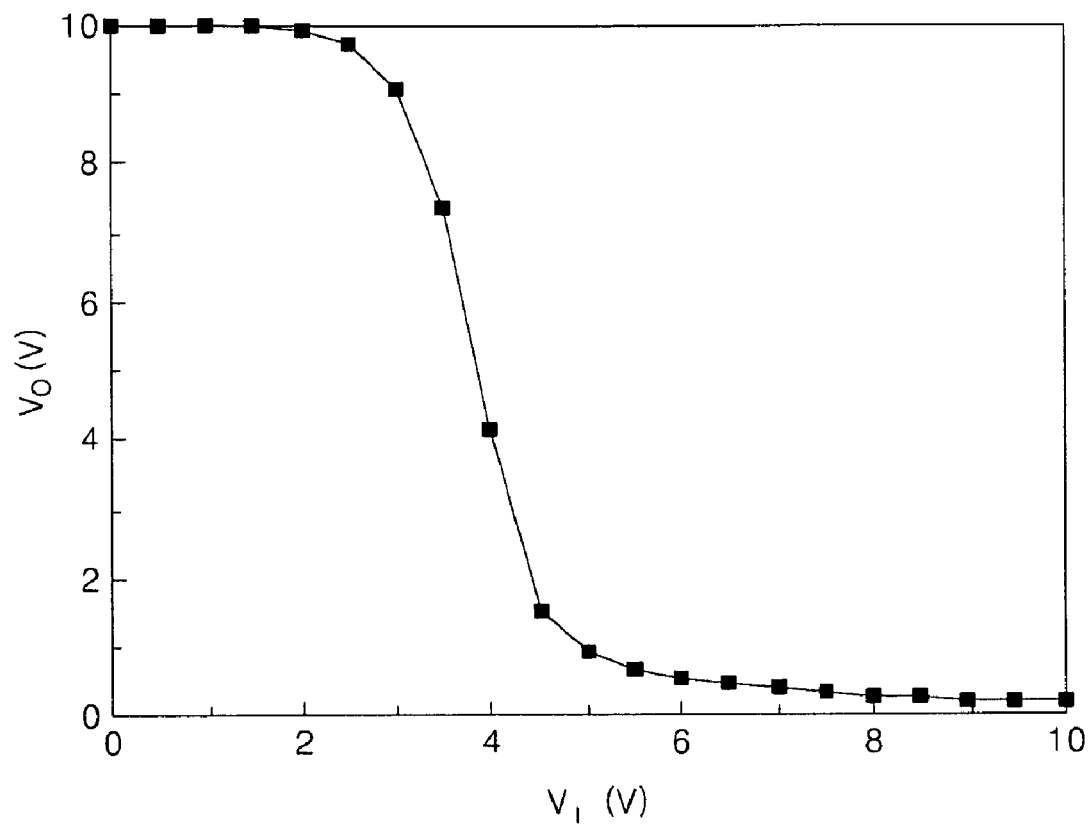

FIG. 13 is a graph illustrating input voltage (VI)-output voltage (VO) characteristics of an inverter according to example embodiments. A power voltage, based on which results of FIG. 13 were obtained, was about 10 V. An input voltage VI and the power voltage may refer to voltages applied to the input terminal Vin and the power source VDD, respectively, and an output voltage VO refers to a voltage detected at the output terminal Vout of FIG. 1.

Referring to FIG. 13, when an input voltage VI is about 0V, the output voltage VO is at a higher level similar to the power voltage, but as the input voltage VI is increased to about 4.5 V or greater, the output voltage VO may be decreased to be near 0 V. Thus, when using the inverter according to example embodiments, the full swing characteristics similar to those of a Si-based CMOS inverter may be obtained.

Figure 14:
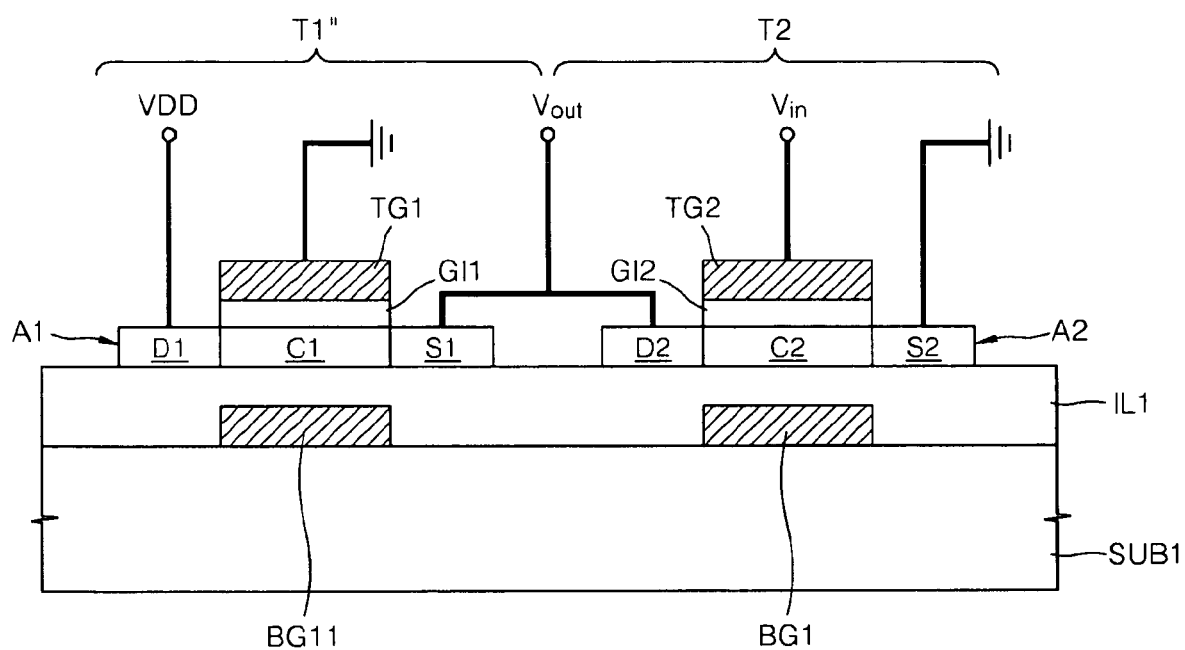

According to example embodiments, in the inverters of FIGS. 1 through 6, both the load transistor T1, T1', T10, T10', T100, and T100' and the driving transistor T2, T2', T20, T20', T200, and T200' may have a double gate structure, wherein an example thereof is illustrated in FIG. 14. Example embodiments are a modified example of the inverter of FIG. 1.

Referring to FIG. 14, another bottom gate BG11 may be disposed below a first channel region C1. Accordingly, both a load transistor T1" and a driving transistor T2 have a double gate structure. The bottom gate BG11 may be configured to adjust the threshold voltage of the load transistor T1" without changing the mode of the load transistor T1". The bottom gate BG11 may be separated from a first top gate TG1 or electrically connected to the first top gate TG1. The structure of the inverter of FIG. 14 may be the same as the inverter of FIG. 1 except the bottom gate BG11, and thus a description of common elements will not be repeated. Also, a plurality of the inverters of FIGS. 1 through 6 and FIG. 14 may be arranged to form a logic circuit, as illustrated in FIGS. 15 and 16.

Figure 15:
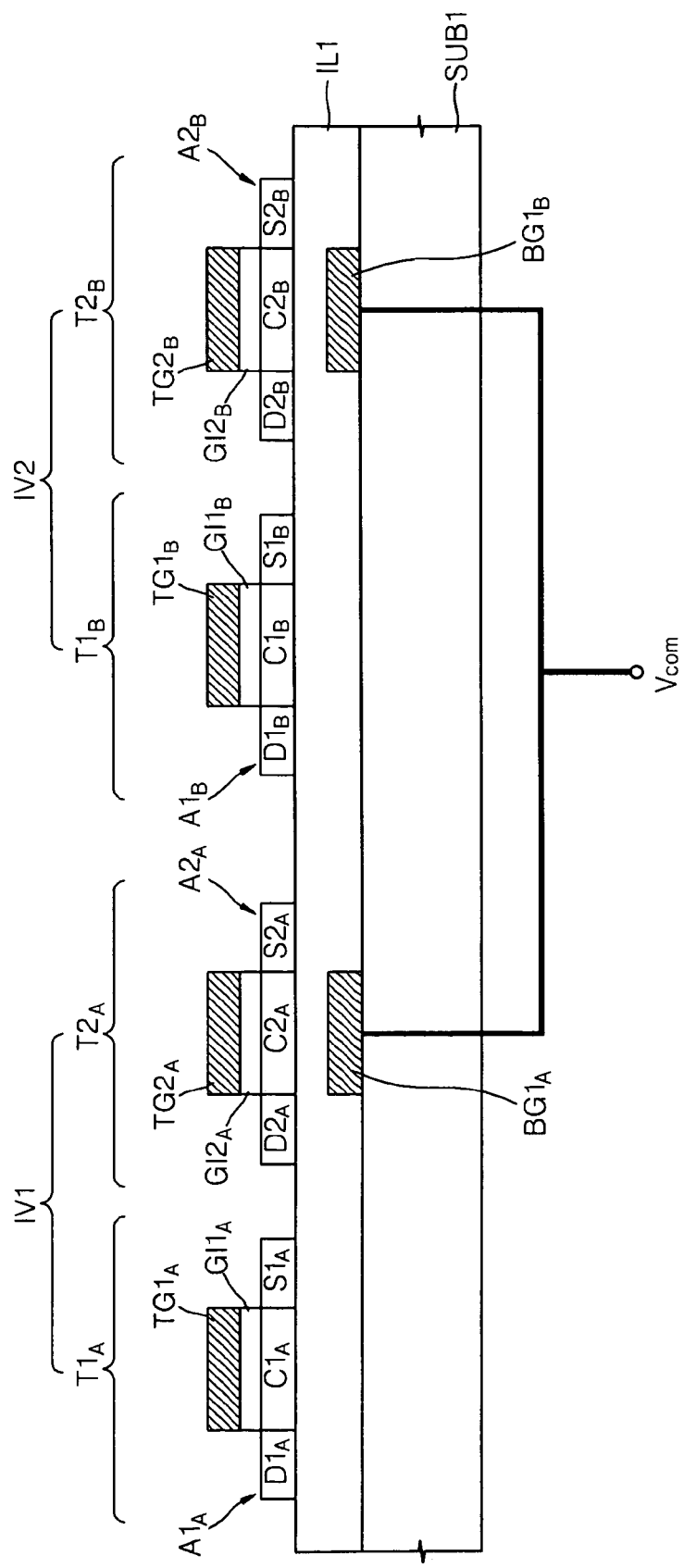

Referring to FIG. 15, two inverters IV1 and IV2 having the structure as illustrated in FIG. 1 formed on a substrate SUB1 are illustrated, but the number of inverters may also be three or more. Bottom gates $BG1_A$ and $BG1_B$ of the driving transistors $T2_A$ and $T2_B$ may be connected to a common power source Vcom and receive an identical signal. In example embodiments, the bottom gates $BG1_A$ and $BG1_B$ and the second top gates $TG2_A$ and $TG2_B$ of the driving transistors $T2_A$ and $T2_B$ may be separated.

Figure 16:
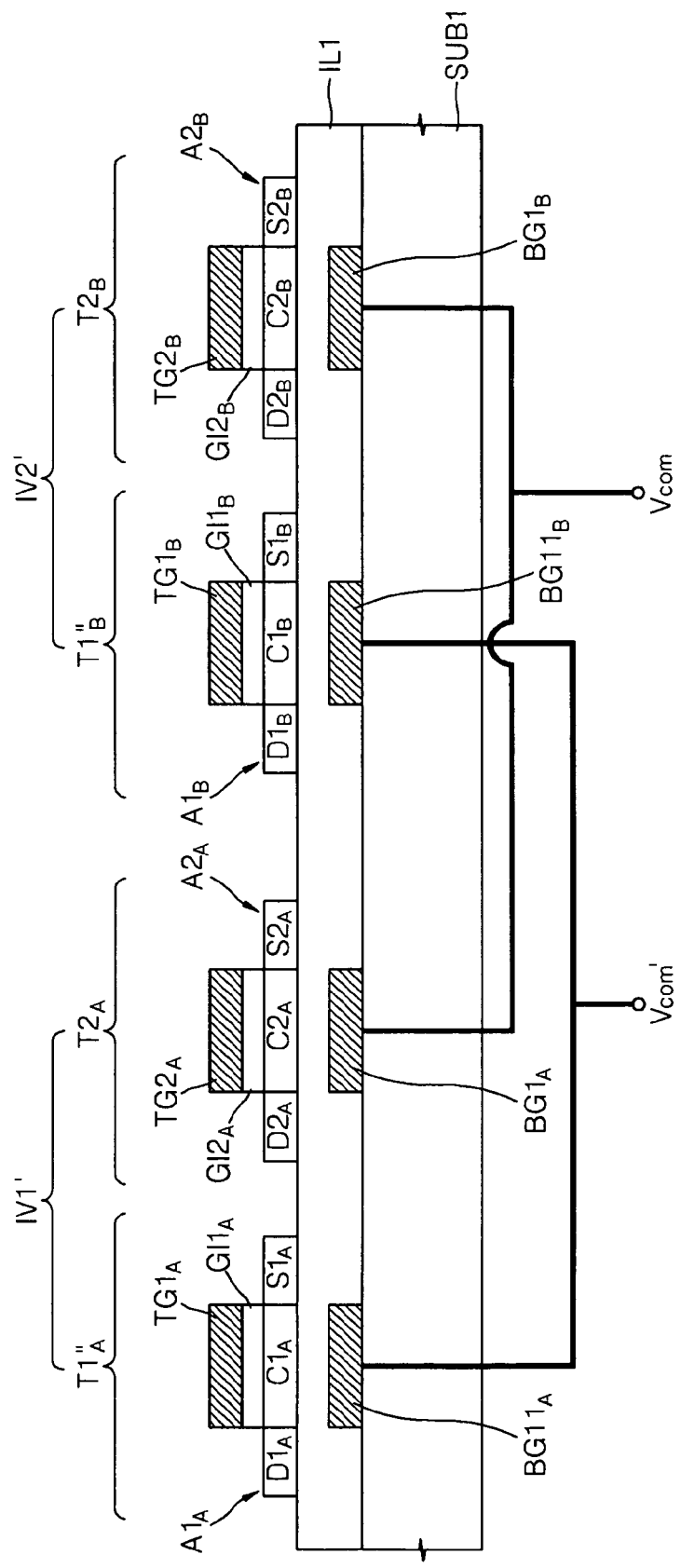

Referring to FIG. 16, two inverters IV1' and IV2' having the structure as illustrated in FIG. 14 may be disposed on a substrate SUB1, but the number of inverters may also be three or more. In example embodiments, bottom gates $BG1_A$ and $BG1_B$ of the driving transistors $T2_A$ and $T2_B$ may be connected to a common power source Vcom and receive an identical signal. Similarly, other bottom gates $BG11_A$ and $BG11_B$ of the load transistors $T1"_A$ and $T1"_B$ may be connected to another common power source Vcom' and may receive an identical signal.

In example embodiments, the bottom gates $BG1_A$ and $BG1_B$ and the second top gates $TG2_A$ and $TG2_B$ of the driving transistors $T2_A$ and $T2_B$ may be separated, and the other bottom gates $BG11_A$ and $BG11_B$ and the first top gates $TG1_A$ and $TG1_B$ of the load transistors $T1"_A$ and $T1"_B$ may also be separated. When the other bottom gates $BG11_A$ and $BG11_B$ and the first top gates $TG1_A$ and $TG1_B$ of the load transistors $T1"_A$ and $T1"_B$ are electrically connected to each other, the other bottom gates $BG11_A$ and $BG11_B$ may not be connected by a common voltage Vcom'. Although not illustrated in the drawing, also when a plurality of inverters of FIGS. 2 through 6 are arranged, one of the two gates may be connected to a common power source.

The above-described inverters according to example embodiments may be used as a basic element of various logic circuits, e.g., a NAND circuit, a NOR circuit, an encoder, a decoder, a multiplexer (MUX), a demultiplexer (DEMUX), or a sense amplifier. The basic structure of the logic circuits is well known in the art, and thus, a description thereof will be omitted.

Also, the inverter and logic circuits including the inverter according to example embodiments may be applied to various fields, e.g., liquid crystal displays (LCDs), organic light emitting devices, or memory devices. In particular, when the load transistor and the switching transistor of the inverter are oxide TFTs, the oxide TFTs may be formed using a lower temperature process, and thus, have improved mobility. For example, an E/D inverter formed of an oxide TFT according to example embodiments may be more easily applied as a peripheral device for three-dimensional stack memories, e.g., a 1D (diode)-1R (resistor) multi-layer cross-point memory device, which may be manufactured using a lower temperature process.

The above description includes a description of the method of operating the inverter according to example embodiments. A brief description of the operating method will be presented. The method of operating the inverter according to example embodiments relates to an inverter including a load transistor and a driving transistor connected to each other, wherein one of the two transistors has a double gate structure, and an operation of varying a threshold voltage of the transistor having the double gate structure is included in the operating method of the inverter.

Varying the threshold voltage may include applying a voltage to at least one of two gates of the transistor having the double gate structure. A negative (−) voltage or a positive (+) voltage may be applied to one of the two gates, or an identical voltage, for example, a positive (+) voltage may be applied to both of the two gates. Thus, by varying the threshold voltage of the transistor having the double gate structure, the inverter may become an E/D mode inverter.

For example, when the driving transistors T2, T20, and T200 have a double gate structure as illustrated in FIGS. 1, 3, and 5, and a negative (−) voltage is applied to one of two gates of the driving transistors T2, T20, and T200, the driving transistors T2, T20, and T200 may be enhancement mode transistors. The two gates of the driving transistors T2, T20, and T200 may be separated. When the two gates of the driving transistors T2, T20, and T200 are electrically connected to each other, the threshold voltage of the driving transistors T2, T20, and T200 may be varied by applying a positive (+) voltage to the two gates.

When the load transistors T1', T10', and T100' have a double gate structure as illustrated in FIGS. 2, 4, and 6, and a positive (+) voltage is applied to one of the two gates of the load transistors T1', T10', and T100', the load transistors T1', T10', and T100' may be depletion mode transistors. The two gates of the load transistors T1', T10', and T100' may be separated. As described above, after adjusting the threshold voltage of the transistor having the double gate structure, a normal operation of the inverter, that is, applying a normal operational voltage to the inverter, may be conducted.

While example embodiments have been particularly shown and described with reference to example embodiments thereof, example embodiments should be considered in a descriptive sense only and not for purposes of limitation. For example, it will be understood by those of ordinary skill in the art that example embodiments may be applied to a non-oxide transistor instead of an oxide-transistor, and to transistors having a structure other than that of a TFT. Also, it will be understood by those of ordinary skill in the art that the structure and elements of the inverter of FIGS. 1 through 7 and FIGS. 13 through 16 may be modified in various ways, and that the inverter and the logic circuits according to example embodiments may be applied not only to liquid crystal displays or organic light emitting devices but also memory devices and other devices. Therefore, the scope of example embodiments is not defined by the detailed description of example embodiments but by the appended claims.

What is claimed is:

1. An inverter comprising:
    a load transistor; and
    a driving transistor connected to the load transistor,
    wherein one of the load transistor and the driving transistor has a double gate structure, and the other of the load transistor and the driving transistor has a single gate structure.

2. The inverter of claim 1, wherein the load transistor is a depletion mode transistor, and the driving transistor is an enhancement mode transistor having the double gate structure.

3. The inverter of claim 1, wherein the load transistor is a depletion mode transistor having the double gate structure, and the driving transistor is an enhancement mode transistor.

4. The inverter of claim 1, wherein the load transistor and the driving transistor are oxide thin film transistors (TFTs).

5. The inverter of claim 4, wherein the load transistor and the driving transistor include channel layers made of a ZnO-based oxide.

6. The inverter of claim 1, wherein the load transistor and the driving transistor are a top gate transistor, and
    one of the load transistor and the driving transistor further includes a bottom gate under the top gate transistor.

7. The inverter of claim 6, wherein the load transistor and the driving transistor include an active layer having a channel region, a source region, and a drain region.

8. The inverter of claim 6, wherein the load transistor and the driving transistor include a channel layer, a source layer contacting a first end of the channel layer, and a drain layer contacting a second end of the channel layer.

9. The inverter of claim 1, wherein each of the load transistor and the driving transistor are a bottom gate transistor, and
    one of the load transistor and the driving transistor further includes a top gate above the bottom gate transistor.

10. The inverter of claim 1, wherein the gates of the double gate structure in either the load transistor or the driving transistor are separated from each other.

11. The inverter of claim 1, wherein the gates of the double gate structure in either the load transistor or the driving transistor are electrically connected to each other.

12. A logic circuit comprising:
    a plurality of the inverters of claim 1.

13. The logic circuit of claim 12, wherein the load transistor and the driving transistor of each of the plurality of inverters are a top gate transistor and one of the load transistor and the driving transistor further includes a bottom gate below the top gate transistor, the bottom gate being separated from the corresponding top gate, and
    the bottom gate of each of the plurality of inverters are electrically connected to one another.

14. The logic circuit of claim 12, wherein the load transistor and the driving transistor of each of the plurality of inverters is a bottom gate transistor and one of the load transistor and the driving transistor further includes a top gate above the bottom gate transistor, the top gate being separated from the corresponding bottom gate, and
    the top gate of each of the plurality of inverters are electrically connected to one another.

15. The logic circuit of claim 12, wherein the logic circuit includes at least one of a NAND circuit, a NOR circuit, an encoder, a decoder, a multiplexer (MUX), a demultiplexer (DEMUX), and a sense amplifier.

16. An inverter comprising:
a load transistor; and
a driving transistor connected to the load transistor,
wherein one of the load transistor and the driving transistor has a double gate structure and the other of the load transistor and the driving transistor has a single gate structure, and
wherein a threshold voltage of the one of the load and the driving transistor having the double gate structure is changed by at least one of two gates of the double gate structure and is different from a threshold voltage of the other of the load and the driving transistor having the single gate structure.

17. The inverter of claim 16, wherein the load transistor is a depletion mode transistor, and the driving transistor is an enhancement mode transistor having the double gate structure.

18. The inverter of claim 16, wherein the load transistor is a depletion mode transistor having the double gate structure, and the driving transistor is an enhancement mode transistor.

19. The inverter of claim 16, wherein the load transistor and the driving transistor are oxide thin film transistors (TFTs).

20. The inverter of claim 19, wherein the load transistor and the driving transistor include channel layers made of a ZnO-based oxide.

21. The inverter of claim 16, wherein the load transistor and the driving transistor are a top gate transistor, and
one of the load transistor and the driving transistor further includes a bottom gate under the top gate transistor.

22. The inverter of claim 21, wherein the load transistor and the driving transistor include an active layer having a channel region, a source region, and a drain region.

23. The inverter of claim 21, wherein the load transistor and the driving transistor include a channel layer, a source layer contacting a first end of the channel layer, and a drain layer contacting a second end of the channel layer.

24. The inverter of claim 16, wherein each of the load transistor and the driving transistor are a bottom gate transistor, and
one of the load transistor and the driving transistor further includes a top gate above the bottom gate transistor.

25. The inverter of claim 16, wherein the gates of the double gate structure in either the load transistor or the driving transistor are separated from each other.

26. The inverter of claim 16, wherein the gates of the double gate structure in either the load transistor or the driving transistor are electrically connected to each other.

* * * * *